United States Patent
Lai

(10) Patent No.: US 7,084,430 B2
(45) Date of Patent: Aug. 1, 2006

(54) PIXEL STRUCTURE AND FABRICATING METHOD THEREOF

(75) Inventor: Han-Chung Lai, Taoyuan Hsien (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 10/906,660

(22) Filed: Mar. 1, 2005

(65) Prior Publication Data
US 2005/0133792 A1 Jun. 23, 2005

Related U.S. Application Data

(62) Division of application No. 10/604,980, filed on Aug. 29, 2003, now Pat. No. 6,875,645.

(30) Foreign Application Priority Data
Oct. 3, 2002 (TW) .............................. 91122802 A

(51) Int. Cl.
*H01L 29/04* (2006.01)

(52) U.S. Cl. ............................ 257/72; 257/79; 257/59; 438/30

(58) Field of Classification Search .................. 257/72, 257/79
See application file for complete search history.

(56) References Cited

U.S. PATENT DOCUMENTS

| 6,232,158 | B1* | 5/2001 | Lee | 438/160 |
| 6,307,602 | B1* | 10/2001 | Song | 349/38 |
| 6,346,730 | B1* | 2/2002 | Kitakado et al. | 257/350 |
| 6,372,560 | B1* | 4/2002 | Jen et al. | 438/160 |
| 6,683,668 | B1* | 1/2004 | Moon et al. | 349/138 |

FOREIGN PATENT DOCUMENTS

JP       10-115842        5/1998

* cited by examiner

*Primary Examiner*—Thao P. Le
(74) *Attorney, Agent, or Firm*—Jiang Chyun IP Office

(57) ABSTRACT

A method of fabricating a pixel structure is provided. A gate, an insulation layer, and a channel layer are sequentially formed over the substrate. A pair of source/drain terminals are formed over the channel layer, consisting a thin film transistor on the substrate. A passivation layer is formed over the thin film transistor. A photoresist layer is formed over the passivation layer. Using the gate, the source/drain terminals as a mask, a back exposure and a photoresist development process are performed to pattern the photoresist layer. Using the patterned photoresist layer as a mask, the passivation layer and the insulation layer are etched to expose a sidewall of the drain terminal. The photoresist layer is removed. A pixel electrode is formed over the passivation layer such that the pixel electrode and the drain terminal are electrically connected through the sidewall of the drain terminal.

8 Claims, 11 Drawing Sheets

PIXEL STRUCTURE AND FABRICATING METHOD THEREOF

CROSS-REFERENCE TO RELATED APPLICATION

This application is a divisional of a prior application Ser. No. 10/604,980, now U.S. Pat. No. 6,875,645 filed Aug. 29, 2003, which claims the priority benefit of Taiwan application serial no. 91122802, filed Oct. 3, 2002.

BACKGROUND OF THE INVENTION

1. Field of Invention

The present invention relates to a semiconductor device structure and fabricating method thereof. More particularly, the present invention relates to a thin film transistor liquid crystal display (TFT-LCD) pixel structure and fabricating method thereof.

2. Description of Related Art

A thin film transistor liquid crystal display (TFT-LCD) is a type of display that comprises a thin film transistor array substrate, a color filter array substrate and a liquid crystal layer. The thin film transistor array substrate includes a plurality of thin film transistors arranged to form an array and a plurality of pixel electrodes corresponding to the thin film transistors. Each thin film transistor has a gate, a channel layer, a drain terminal and a source terminal. The thin film transistor actually serves as a switching element in each liquid crystal display unit.

The operating principles of a thin film transistor are very similar to a conventional MOS device. Both the thin film transistor and the MOS device have three terminals (a gate terminal, a drain terminal and a source terminal). According to the fabricating material, a thin film transistor can be categorized as an amorphous silicon transistor or a polysilicon transistor. Since the amorphous silicon transistor has been around for some time, the fabricating technique is relatively mature. The fabrication of an amorphous silicon transistor typically involves forming a gate, a channel layer, source/drain terminals, a pixel electrode and a passivation layer over a substrate. Although amorphous silicon transistor has been developed for some time, researchers are still actively looking for innovative steps that can reduce the number of masking steps and increase production yield.

FIGS. 1A to 1E are schematic cross-sectional views showing the progression of steps for producing the pixel of a conventional thin film transistor liquid crystal display. The fabrication process includes five masking steps. First, as shown in FIG. 1A, a metallic layer is formed over a substrate 100. A first masking step is performed to pattern out a gate 102. Thereafter, insulation material is deposited over the substrate 100 globally to form an insulation layer 104 that covers the gate 102. That portion of the insulation layer 104 covering the gate 102 serves as a gate insulation layer.

As shown in FIG. 1B, an amorphous silicon layer (not shown) is formed over the insulation layer 104. A second masking step is performed to pattern out a channel layer 106. The channel layer 106 is formed over the gate insulation layer 104 above the gate 102. An ohmic contact layer (not shown) may also be formed over the channel layer 106.

As shown in FIG. 1C, another metallic layer (not shown) is formed over the substrate 100. A third masking step is carried out to pattern the metallic layer into source/drain terminals 108b/108a. In this step, a definite thickness of the channel layer 106 is also removed.

As shown in FIG. 1D, a passivation layer 110 is formed over the source/drain terminals 108b/108a. A fourth masking step is carried out to pattern the passivation layer 110. Thus, an opening 112 that exposes the drain terminal 108a is formed in the passivation layer 110.

Finally, as shown in FIG. 1E, an indium-tin oxide electrode layer is formed over the passivation layer 110 and inside the opening 112. A fifth masking step is carried out to pattern the indium-tin oxide layer into a pixel electrode 114. The pixel electrode 114 and the drain terminal 108a are electrically connected through conductive material within the opening 112.

In the aforementioned process of fabricating a TFT-LCD, altogether five masking steps are required. Since each masking step involves a series of sub-steps including moisture-release baking, coating, photoresist depositing, soft baking, photo-exposure, post-exposure baking, chemical development, hard baking and etching, each additional masking step will increase production cost considerably. Moreover, each additional sub-step carried out in the masking operation such as a moisture-release baking or coating will lower overall product yield.

SUMMARY OF THE INVENTION

Accordingly, one object of the present invention is to provide a pixel structure and fabricating method thereof that can reduce the number of masking steps.

A second object of this invention is to provide a pixel structure and fabricating method thereof that can simplify the fabrication of the pixel structure and hence reduce production cost.

To achieve these and other advantages and in accordance with the purpose of the invention, as embodied and broadly described herein, the invention provides a method of forming a pixel structure. First, a gate and a scan line having connection with the gate is formed over a substrate. An insulation layer is formed over the substrate covering the gate and the scan line. Thereafter, a channel layer is formed over the insulation layer above the gate. Source/drain terminals are formed over the channel layer to form a thin film transistor. At the same time, a data line having connection with one of the source/drain terminals is formed over the insulation layer. Furthermore, a conductive layer is formed over another scan line next to the scan line when the source/drain terminals are formed. The conductive layer, the scan line and the insulation layer between the conductive layer and the scan line together constitute a pixel storage capacitor. A passivation layer is formed over the substrate covering the thin film transistor. A photoresist layer is formed over the passivation layer. Using the gate, the source/drain terminals, the scan line, the data line and the conductive layer as a mask, a back exposure process and a chemical development process are performed to pattern the photoresist layer. Using the patterned photoresist layer as an etching mask, the passivation layer and the insulation layer are patterned such that one of the sidewalls of the source/drain terminal and one of the sidewalls of the conductive layer are exposed. The photoresist layer is removed and then a pixel electrode is formed over the passivation layer. The pixel electrode is electrically connected to the drain terminal through the drain terminal sidewall. In addition, the sidewall of the conductive layer and the pixel electrode are also electrically connected so that both the conductive layer and the pixel electrode are at an identical potential level. This invention may further include the step of forming an opening that exposes the drain terminal is also formed in the passivation layer. The pixel electrode is electrically connected to the drain terminal through conductive material in the opening and sidewall of the drain terminal.

This invention also provides an alternative method of fabricating a pixel structure. First, a gate and a scan line having connection with the gate are formed on a substrate. An insulation layer is formed over the substrate covering the gate and the scan line. Thereafter, a channel material layer is formed over the insulation layer and then a metallic layer is formed over the channel material layer. A patterned first photoresist layer is formed over the metallic layer. Using the first photoresist layer as a mask, the metallic layer is patterned to define a data line and a source/drain metallic layer. Using the first photoresist layer as a mask again, the channel material layer is patterned to define a channel layer. Using the first photoresist as a mask layer for the third time, the source/drain metallic layer is patterned to define a source/drain terminal. The source terminal is electrically connected to the data line. The gate, the channel layer and the source/drain terminals together constitute a thin film transistor. Furthermore, a conductive layer is formed over another scan line next to the scan line when the source/drain terminals are formed. The conductive layer, the scan line and the insulation layer between the conductive layer and the scan line together constitute a pixel storage capacitor. The first photoresist layer is removed and then a passivation layer is formed over the substrate covering the thin film transistor. Next, a second photoresist layer is formed over the passivation layer. Using the gate, the source/drain terminals, the scan line, the data line and the conductive layer as a mask, a back exposure process and a chemical development process are performed to pattern the second photoresist layer. Using the patterned second photoresist layer as an etching mask, the passivation layer and the insulation layer are patterned such that one of the sidewalls of the source/drain terminal and one of the sidewalls of the conductive layer are exposed. The second photoresist layer is removed and then a pixel electrode is formed over the passivation layer. The pixel electrode is electrically connected to the drain terminal through the sidewall of the drain terminal. In addition, the sidewall of the conductive layer and the pixel electrode are also electrically connected so that both the conductive layer and the pixel electrode are at an identical potential level. This invention may further include the step of forming an opening that exposes the drain terminal that is also formed in the passivation layer. The pixel electrode is electrically connected to the drain terminal through conductive material in the opening and sidewall of the drain terminal.

This invention also provides a pixel structure suitable for building over a substrate. The pixel structure includes a thin film transistor, an insulation layer, a passivation layer and a pixel electrode. The pixel structure is controlled through a scan line and a data line. The thin film transistor is formed over the substrate. The thin film transistor has a gate terminal, a channel layer and source/drain terminals. The scan line is formed on the substrate. The scan line and the gate terminal are electrically connected. The data line is also formed on the substrate. The data line and the source terminal are electrically connected. The insulation layer is formed over the substrate only where the gate, the source/drain terminals, the data line and the scan line are located. The insulation layer covers the gate terminal and the scan line. Similarly, the passivation layer is formed over the substrate only where the gate, the source/drain terminals, the data line and the scan line are located. The passivation layer covers the source/drain terminals and the data line. One of the sidewalls of the source/drain terminal is exposed. In addition, the pixel electrode is formed over the substrate. The pixel electrode corresponds in position to the thin film transistor. The pixel electrode and the sidewall of the drain terminal of the thin film transistor are electrically connected. The pixel structure of this invention may further include a conductive layer over another scan line next to the scan line. Furthermore, the conductive layer, the scan line and the insulation layer between the conductive layer and the scan line together constitute a pixel storage capacitor. The sidewall of the conductive layer and the pixel electrode are electrically connected so that the conductive layer and the pixel electrode are at an identical potential level. This invention may further include a conductive structure within the passivation layer such that the pixel electrode and the drain terminal are electrically connected through the conductive structure and the sidewall of the drain terminal.

In fabricating the pixel structure of this invention, the passivation layer is directly patterned using metallic material layers (including the gate and the source/drain terminals) as photo-masks. Hence, one less masking step is required.

Moreover, the drain terminal of the thin film transistor and the pixel electrode in the pixel structure of this invention can be directly connected through the exposed sidewall of the drain terminal through a piece of conductive material embedded within an opening inside the passivation layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
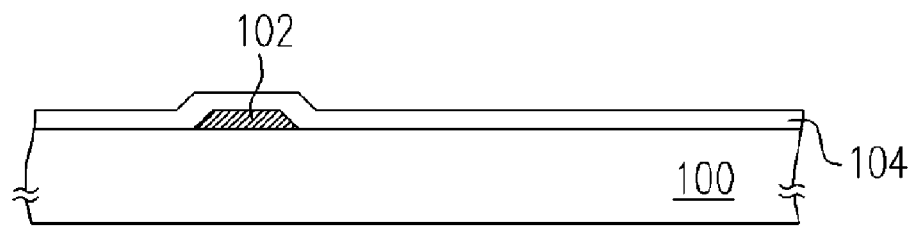
FIGS. 1A to 1E are schematic cross-sectional views showing the progression of steps for producing the pixel of a conventional thin film transistor liquid crystal display.
Figure 1B:
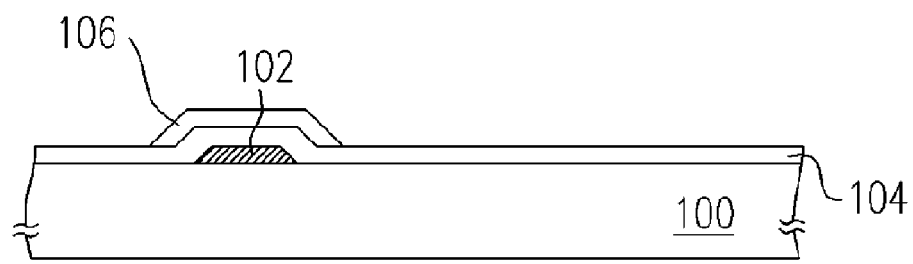
Figure 1C:
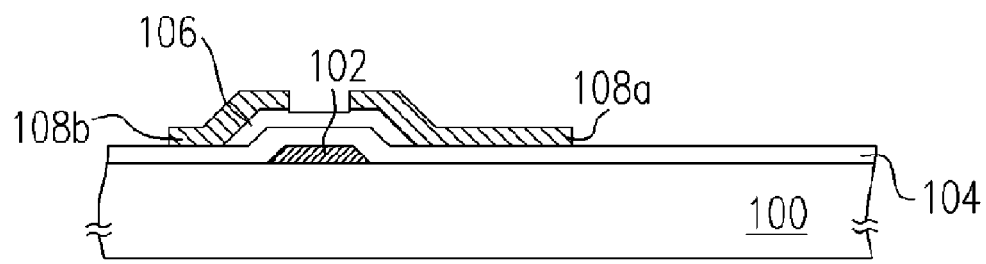
Figure 1D:
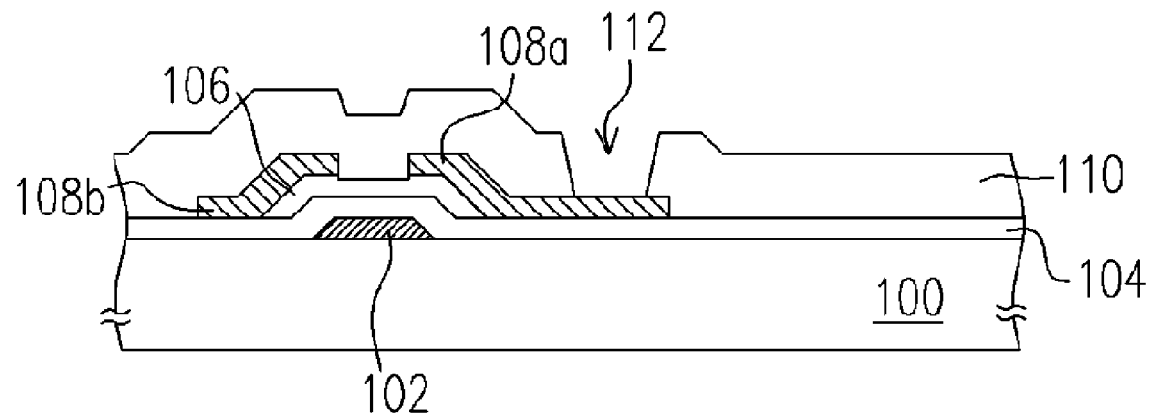
Figure 1E:
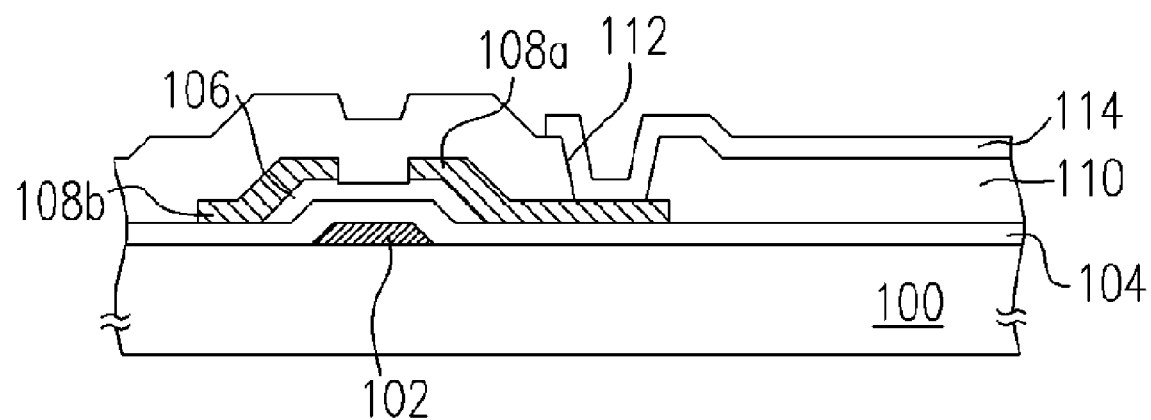

Reference will now be made in detail to the present preferred embodiments of the invention, examples of which are illustrated in the accompanying drawings. Wherever possible, the same reference numbers are used in the drawings and the description to refer to the same or like parts.

Figure 2:
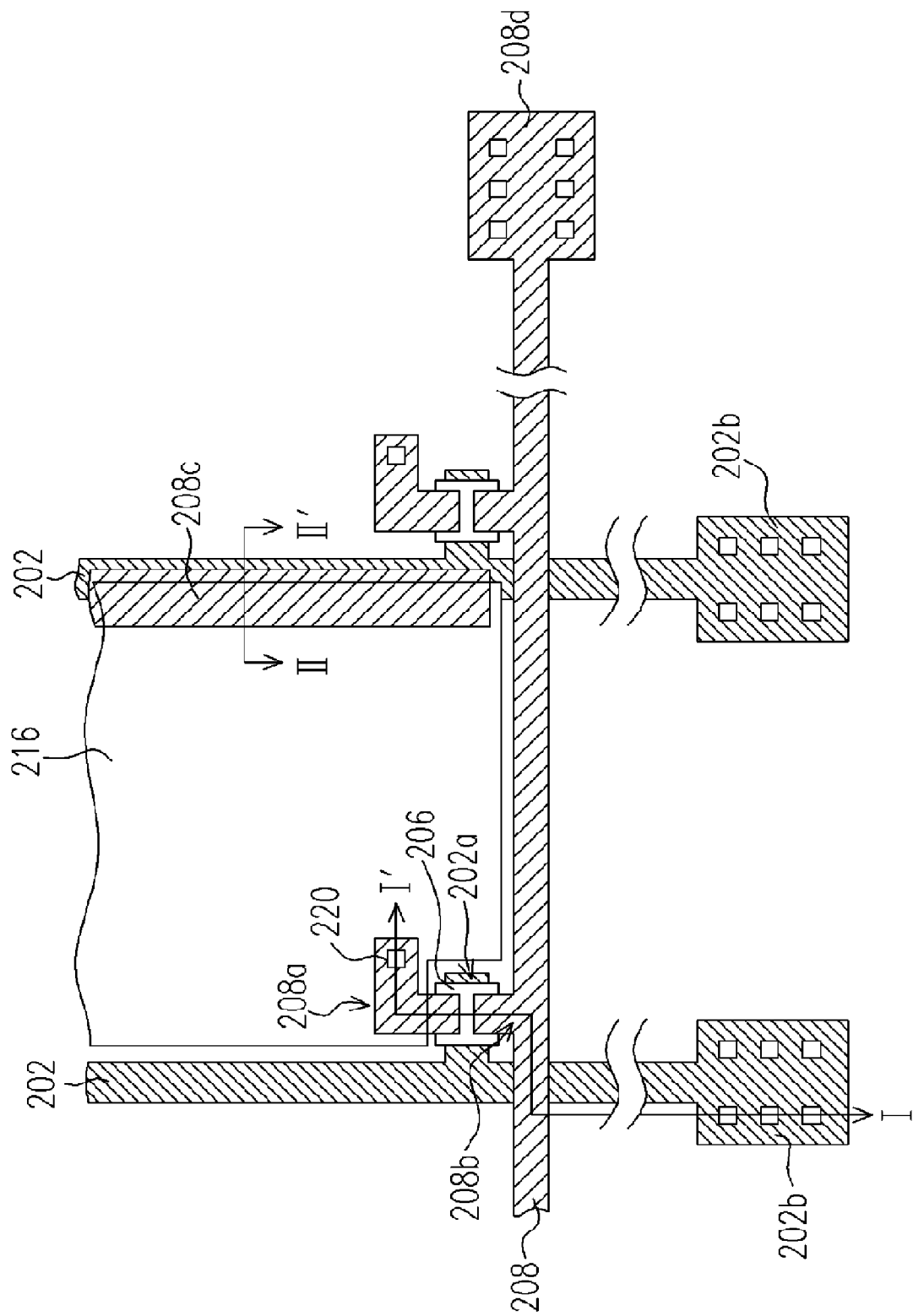
FIG. 2 is a top view of a pixel structure of a thin film transistor liquid crystal display according to a first preferred embodiment of this invention.
Figure 3A:
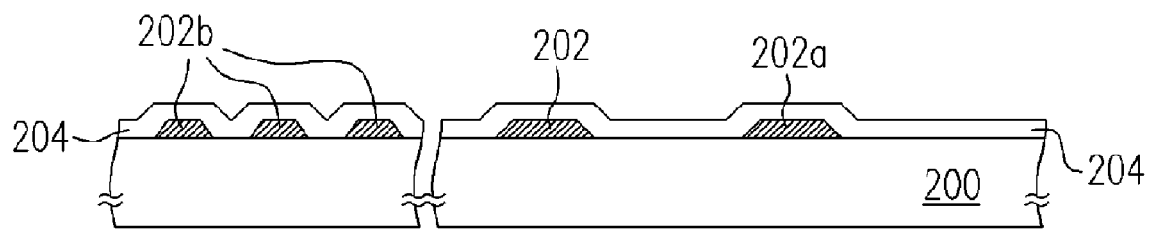
FIGS. 3A to 3H are schematic cross-sectional views showing the progression of steps for fabricating a pixel structure like the cross-sectional structure along line I–I' of FIG. 2.

FIG. 2 is a top view of a pixel structure of a thin film transistor liquid crystal display according to a first preferred embodiment of this invention. FIGS. 3A to 3H are schematic cross-sectional views showing the progression of steps for fabricating a pixel structure like the cross-sectional structure along line I–I' of FIG. 2. As shown in FIGS. 2 and 3A, a substrate 200 such as a glass substrate or a transparent plastic substrate is provided. Metallic material is next deposited over the substrate 200 to a thickness such as several thousand Angstroms to form a metallic layer (not shown). The metallic layer is formed, for example, by sputtering metallic material such as tantalum, titanium or aluminum. Thereafter, a first masking step is carried out to pattern the metallic layer into a scan line 202, a gate 202a and a metallic pad 202b. Each scan line 202 extends towards the edge of the substrate 200 such that the end of the scan line 202 is patterned into the metallic pad 202b for connecting with a chip driver.

An insulation layer 204 is formed over the substrate 200 globally so that the gate line 202, the gate 202a and the metallic pad 202b are covered. The insulation layer 204 is a silicon nitride layer or an oxide layer formed, for example, by conducting a plasma-enhanced chemical vapor deposition (PECVD). The insulation layer 204 on the gate 202a serves as a gate insulation layer.

Figure 3B:
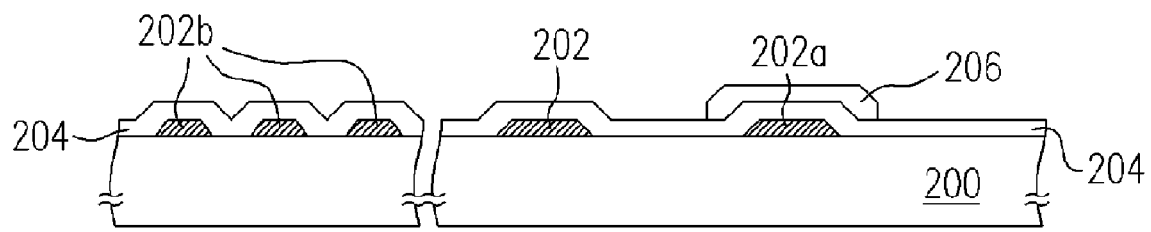

As shown in FIG. 3B, a channel material layer (not shown) is formed over the insulation layer 204. A second masking step is carried out to pattern the channel material layer into a channel layer 206. The channel layer 206 is formed over the gate insulation layer 204 above the gate 202a. An ohmic contact layer (not shown) may also be formed on the surface of the channel layer 206. The channel layer 206 is an amorphous silicon (a-Si) layer and the ohmic contact layer is a doped amorphous silicon layer (n+-Si), for example.

Figure 3C:
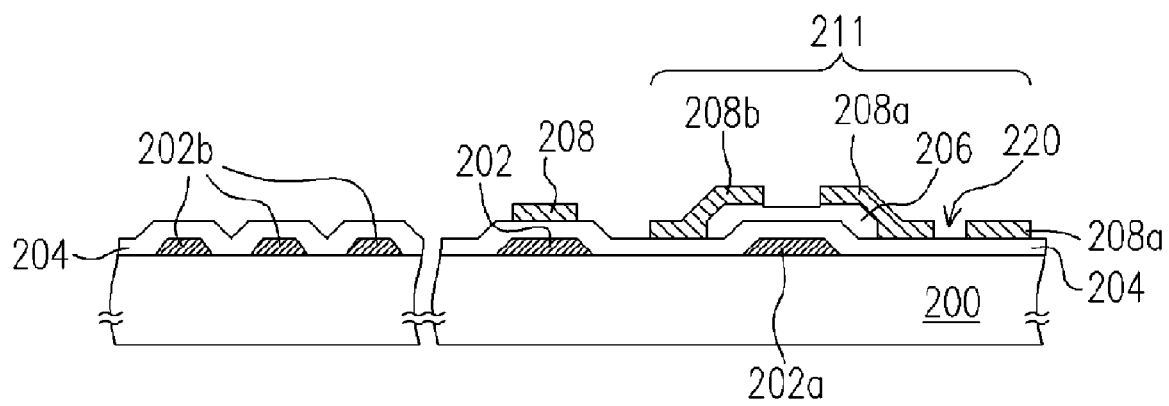

As shown in FIGS. 2 and 3C, another metallic layer (not shown) is formed over the substrate 200. The metallic layer is made of chromium, for example. Thereafter a third masking step is carried out to pattern the metallic layer into a data line 208, source/drain terminals 208a/208b, a conductive layer 208c and a metallic pad 208d. The third masking step also removes a definite thickness from the channel layer 206. In addition, an opening 220 is also formed in the drain terminal 208a while the metallic layer is patterned. The opening 220 serves as a receptacle for conductive material that serves as an electrical connection between a subsequently formed pixel electrode and the drain terminal 208a. In this embodiment, however, the opening 220 in the drain terminal 208 can be selectively formed. In other words, connection with the drain terminal 208a can be achieved by other means.

At the end of the aforementioned steps, the gate 202a, the channel layer 206 and the source/drain terminals 208a/208b together constitute a thin film transistor 211. Moreover the data line 208 extending to the edge of the substrate 200 is connected to a metallic pad 208d for subsequent connection with a driver chip. In addition, the scan line 202 underneath the conductive layer 208c and the insulation layer 204 between the conductive layer 208c and the scan line 202 together constitute a pixel storage capacitor structure.

Figure 3D:
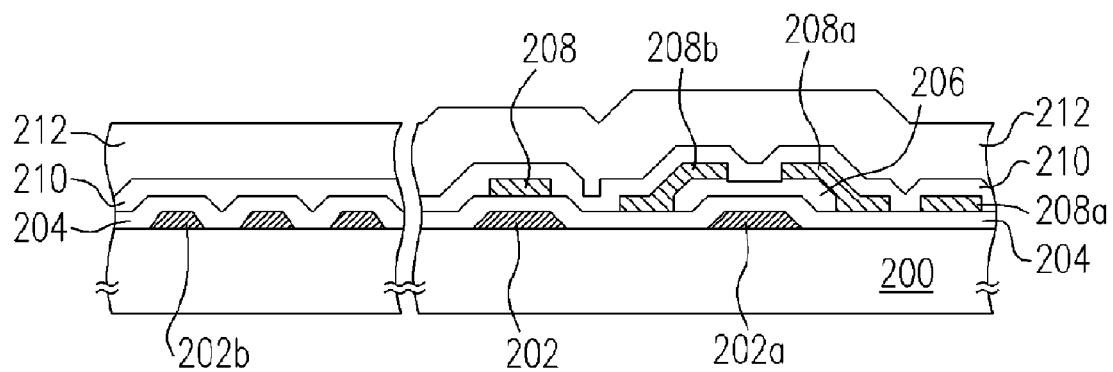

As shown in FIG. 3D, a passivation layer 210 is formed over the substrate 200 globally such that the thin film transistor 211 is also covered. The passivation layer 210 is a silicon nitride layer formed, for example, by conducting a plasma-enhanced chemical vapor deposition. Thereafter, a photoresist layer 212 is formed over the passivation layer 210.

Figure 3E:
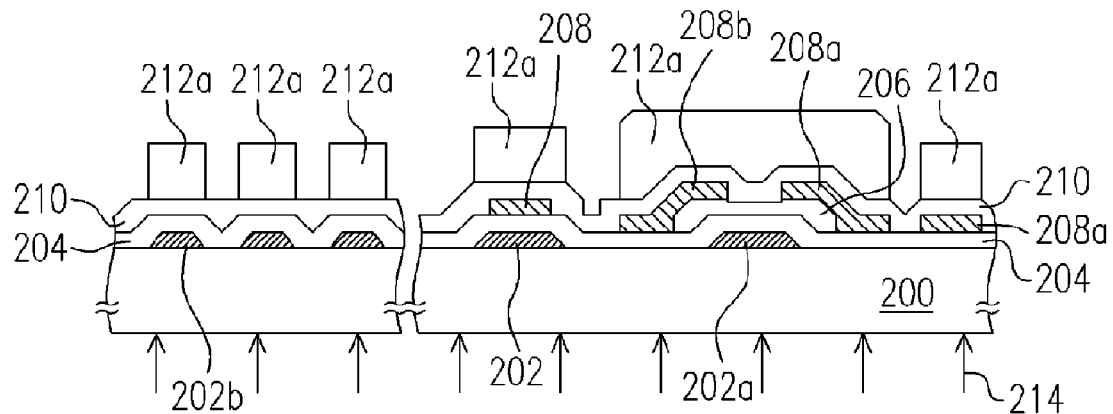

As shown in FIG. 3E, using the scan line 202, the gate 202a, the data line 208, the source/drain terminals 208a/208b, the conductive layer 208c and the metallic pads 202b, 208d as a photo-mask, a back exposure process 214 is carried out. In the back exposure process 214, a beam of light shines into the substrate 200 from its back. The photoresist layer 212 is chemically developed to form a patterned photoresist layer 212a.

Figure 3F:
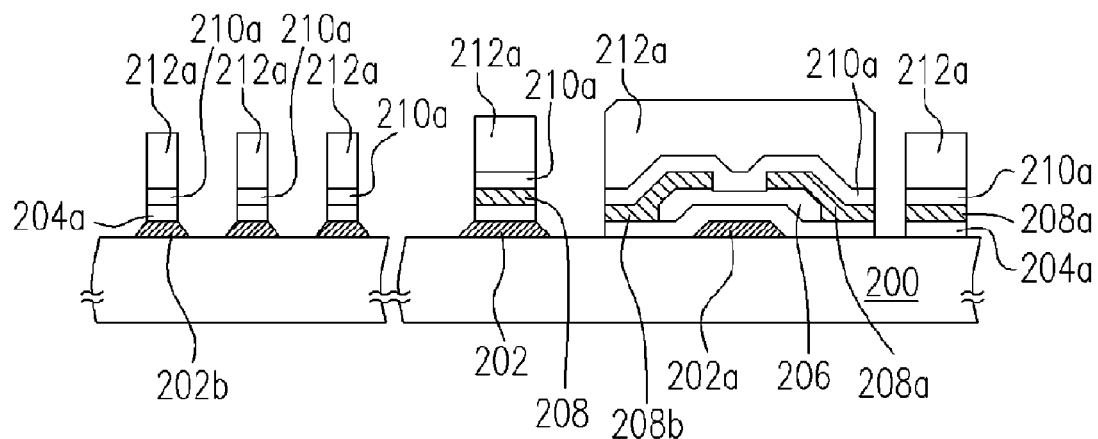

As shown in FIG. 3F, using the patterned photoresist layer 212a as an etching mask, a portion of the passivation layer 210 and the insulation layer 204 is removed to form a patterned passivation layer 210a and a patterned insulation layer 204a. Note that the sidewall of a portion of the metallic material layer (including the sidewalls of the source/drain terminals 208a/208b) formerly used as a mask in photo-exposure is also exposed after the etching process. In other words, the outer sidewall of the drain terminal 208a is exposed. In addition, if the drain terminal 208a includes an opening 220, the inner sidewalls of the opening 220 are similarly exposed.

Note also that there is no need to fabricate a special photo-mask. This is because the scan line 202, the gate 202a, the data line 208, the source/drain terminals 208a/208b, the conductive layer 208c and the metallic pads 202b, 208c together can serve as a photo-mask. Therefore, this invention eliminates the need for producing a photo-mask to pattern the passivation layer.

Figure 3G:
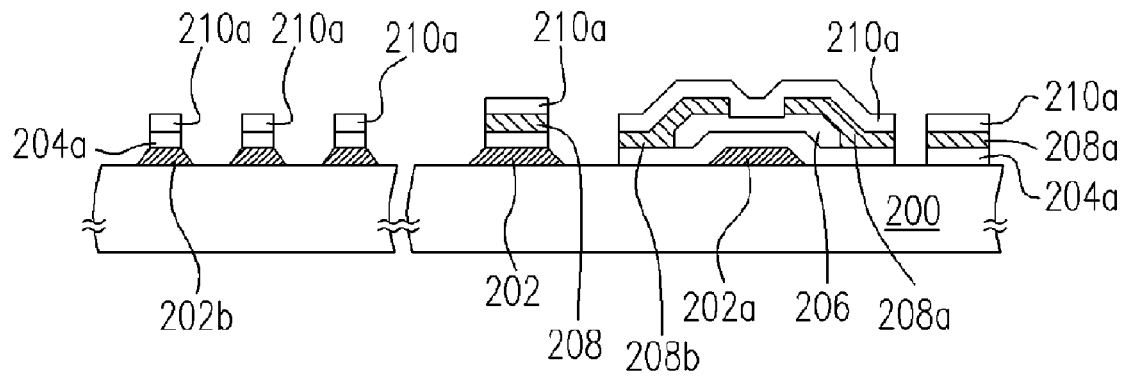
Figure 3H:
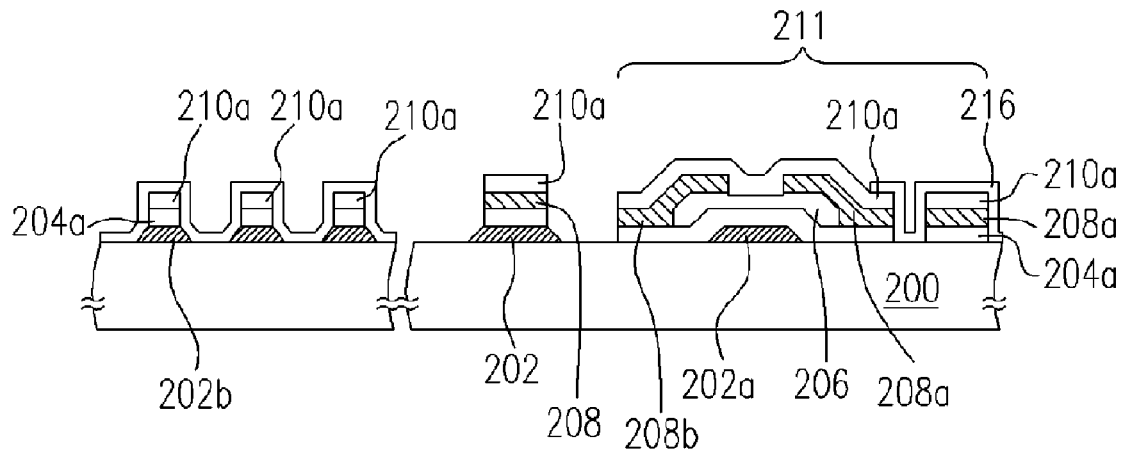

As shown in FIGS. 2, 3G and 3H, the photoresist layer 212a is removed and then a transparent electrode layer (not shown) is formed over the passivation layer 210a. The transparent electrode layer is an indium-tin oxide layer having a thickness of about 1000 Å formed by sputtering, for example. Thereafter, a fourth masking step is carried out to pattern the transparent electrode into a pixel electrode 216 that also covers over the drain terminal 208a.

Since the sidewall of the drain terminal 208a has already been exposed in a previous step, the pixel electrode 216 and the drain terminal 208a are electrically connected through the exposed sidewall of the drain terminal 208a. Similarly, the metallic pads 202b, 208d and the overlying transparent electrode layer are electrically connected through the exposed sidewalls.

Figure 4:
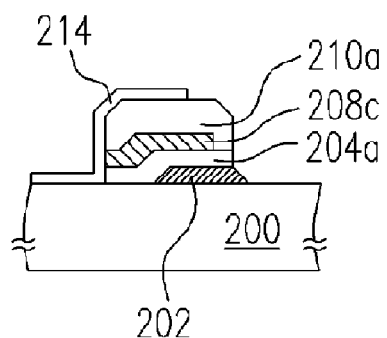
FIG. 4 is a cross-sectional view of the pixel storage capacitor structure along line II–II' of FIG. 2.

FIG. 4 is a cross-sectional view of the pixel storage capacitor structure along line II–II' of FIG. 2. As shown in FIG. 4, the scan line 202 is the lower electrode, the conductive layer 208c is the upper electrode and the insulation layer 204a between the scan line 202 and the conductive layer 208c is the dielectric layer of a pixel storage capacitor. Because the passivation layer 210a and the insulation layer 204a have already been patterned in previous steps and a sidewall of the conductive layer 208c is already exposed, the conductive layer 208c and the pixel electrode 216 are electrically connected through the exposed sidewall of the conductive layer 208c. Consequently, the conductive layer 208c that also serves as the upper electrode of the pixel storage capacitor and the pixel electrode 216 are at an identical potential level.

The pixel structure according the first embodiment of this invention comprises a substrate 200, a thin film transistor 211, a pixel electrode 216, a conductive layer 208c, a patterned insulation layer 204a and a patterned passivation layer 210a. The pixel electrode is under the control of the data line 208 and the scan line 202.

The thin film transistor 211 is formed over the substrate 200. The thin film transistor 211 has a gate 202a, a channel layer 206 and source/drain terminals 208a/208b. The gate 202a and the scan line 202 are electrically connected. The gate 202a and the channel layer 206a are electrically insulated through the patterned insulation layer 204a. The source/drain terminals 208a/208b and the data line 208 above the channel layer 206 are electrically connected. The patterned passivation layer 210a is formed over the thin film transistor 211 for protecting the thin film transistor 211. The conductive layer 208c is formed over the insulation layer 204a either above the previous or the next scan line 202 in the pixel structure. The conductive layer 208c, the insulation layer 204a and scan line 202 under the conductive layer 208c together form the pixel storage capacitor of the pixel structure.

In the pixel structure of this invention, the passivation layer 210a and the insulation layer 204a is formed in regions having a metallic material layer such as the gate 202a, the source/drain terminals 208a/208b, the conductive layer 208c, the data line 208, the scan line 202 and the metallic pads 202b, 208d only. Furthermore, a portion of the sidewalls of the metallic material layer is also exposed.

In addition, a pixel electrode 216 is formed over the passivation layer 210a. The pixel electrode 216 is electrically connected to the drain terminal 208a through an exposed sidewall of the drain terminal 208a. The pixel electrode 216 is also similarly electrically connected to the underlying conductive layer 208c through an exposed sidewall of the conductive layer 208c. This invention may further include a conductive structure 220 formed within the passivation layer 210a such that the pixel electrode 216 and the source terminal 208a are electrically connected through the conductive structure 220 as well as the sidewall of the drain terminal 208a.

Figure 5:
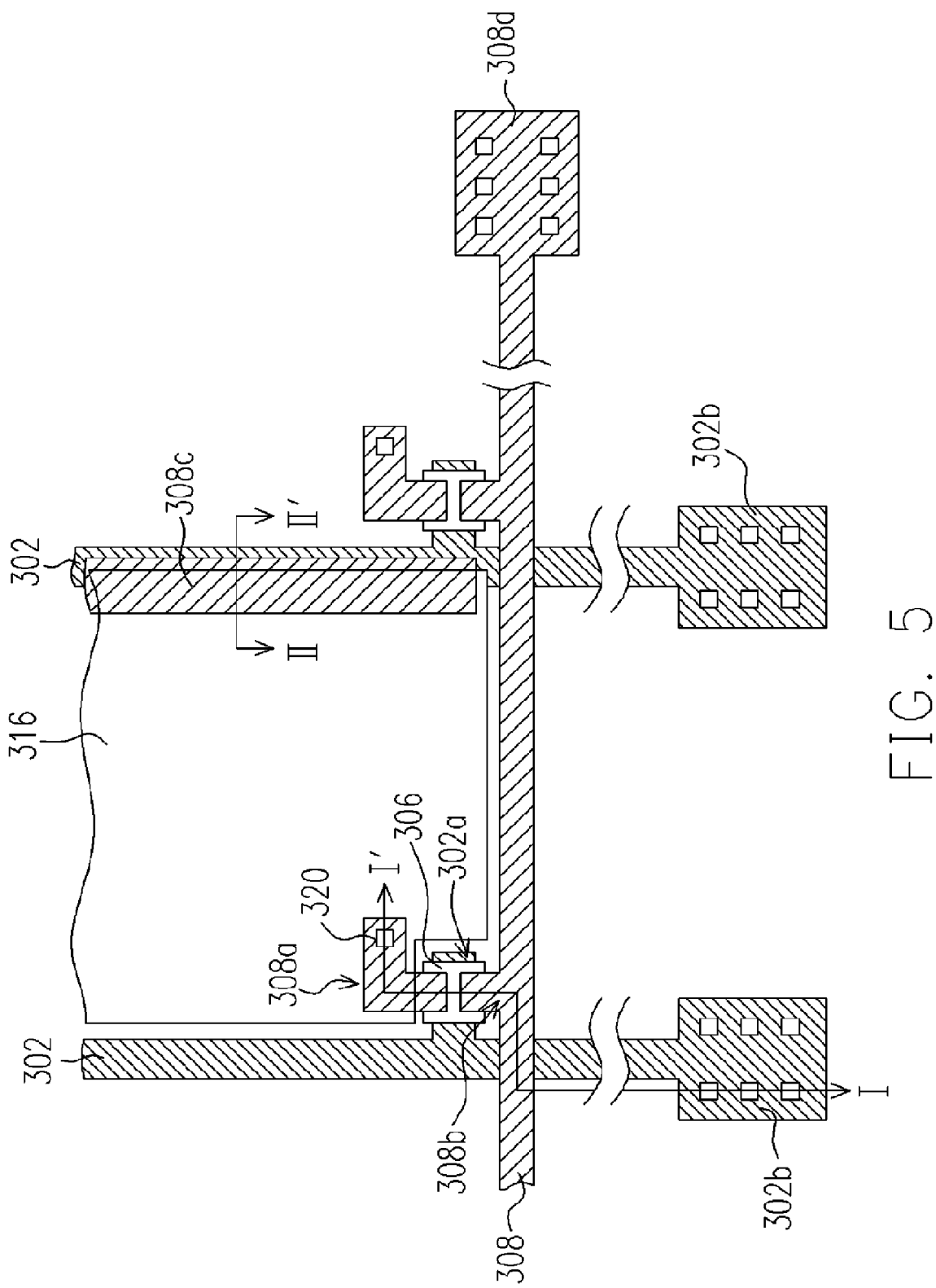
FIG. 5 is a top view of a pixel structure of a thin film transistor liquid crystal display according to a second preferred embodiment of this invention.
Figure 6A:
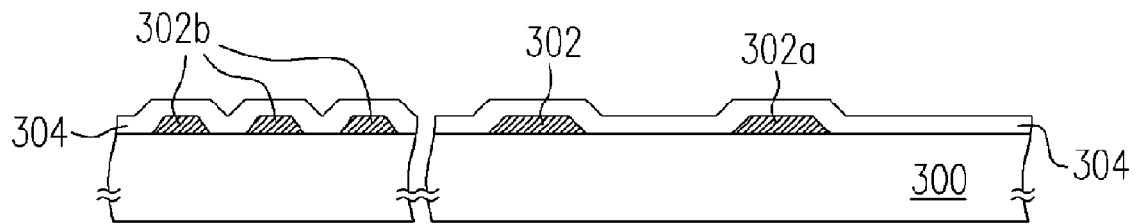
FIGS. 6A to 6J are schematic cross-sectional views showing the progression of steps for fabricating a pixel structure like the cross-sectional structure along line I–I' of FIG. 5.

FIG. 5 is a top view of a pixel structure of a thin film transistor liquid crystal display according to a second preferred embodiment of this invention. FIGS. 6A to 6J are schematic cross-sectional views showing the progression of steps for fabricating a pixel structure like the cross-sectional structure along line I–I' of FIG. 5. As shown in FIGS. 5 and 6A, a substrate 300 such as a glass substrate or a transparent plastic substrate is provided. Metallic material is next deposited over the substrate 300 to a thickness such as several thousand Angstroms to form a metallic layer (not shown). The metallic layer is formed, for example, by sputtering metallic material such as tantalum, titanium or aluminum. Thereafter, a first masking step is carried out to pattern the metallic layer into a scan line 302, a gate 302a and a metallic pad 302b. Each scan line 302 extends towards the edge of the substrate 300 such that the end of the scan line 302 is patterned into the metallic pad 302b for connecting with a chip driver.

An insulation layer 304 is formed over the substrate 300 globally so that the gate line 302, the gate 302a and the metallic pad 302b are covered. The insulation layer 304 is a silicon nitride layer or an oxide layer formed, for example, by conducting a plasma-enhanced chemical vapor deposition (PECVD). The insulation layer 304 on the gate 302a serves as a gate insulation layer.

Figure 6B:
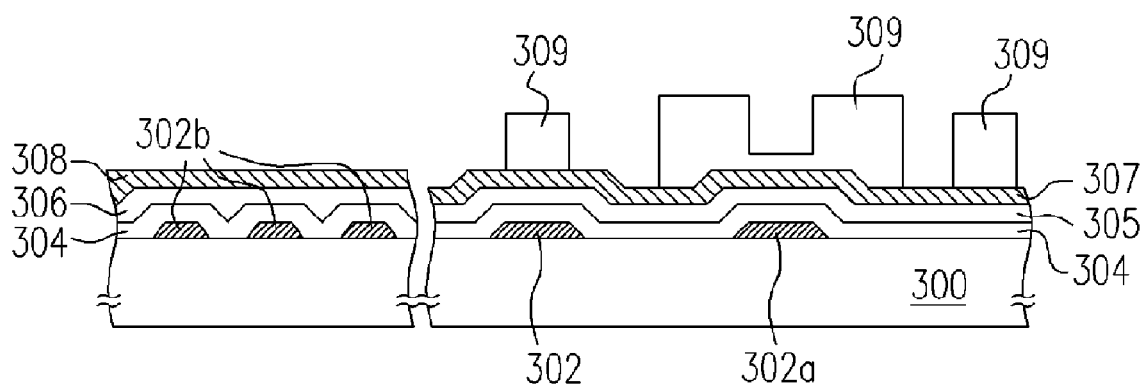

As shown in FIG. 6B, a channel material layer 305 and a metallic layer 307 are sequentially formed over the insulation layer 304. In this embodiment, an ohmic contact layer (not shown) may also form on the surface of the channel material layer 305. The channel material layer is a doped amorphous silicon (n+-Si) layer and the metallic layer 307 is a chromium layer, for example.

Thereafter, a patterned photoresist layer 309 is formed over the metallic layer 307. The photoresist layer 309 is patterned through a second masking step. The patterned photoresist layer 309 has a thickness corresponding to the region having the gate 302a. However, the patterned photoresist layer 309 has a thickness smaller than the area destined to form the data line, the source/drain terminals, the conductive layer and the metallic pad.

Figure 6C:
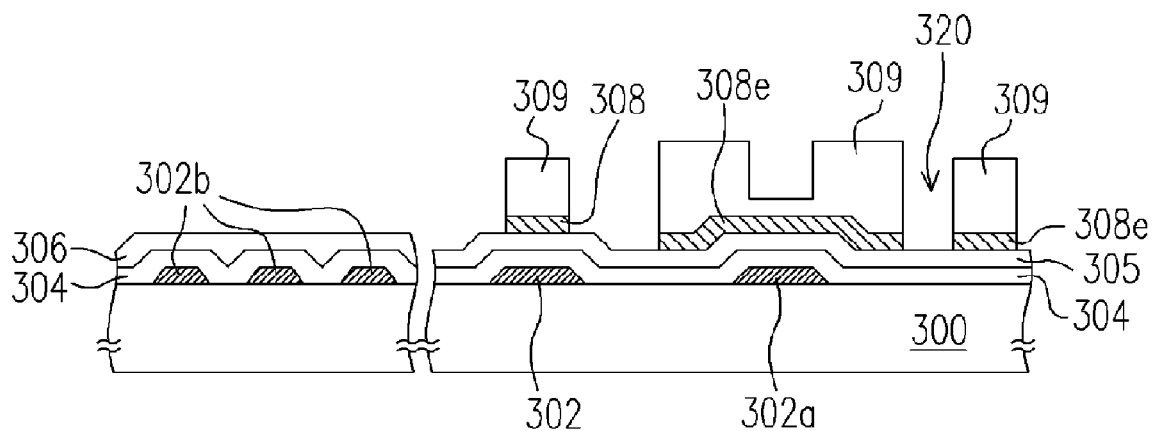

As shown in FIGS. 5 and 6C, using the photoresist layer 309 as an etching mask, the metallic layer 307 is patterned to define the positions for forming a data line 308, a conductive layer 308c, a metallic pad 308d and a source/drain metallic layer 308e. The source/drain metallic layer 308e is the area destined for forming the source/drain terminals. An opening 320 is also patterned within the source/drain metallic layer 308e when the metallic layer 307 is patterned so that the drain terminal may connect electrically with a subsequently formed pixel electrode. In this embodiment, the opening 320 is formed by selection. In other words, electrical connection with the pixel electrode can be made by some other means aside from through the opening 320. The data line 308 extends towards the edge of the substrate 300 and connects with the metallic pad 308d. The metallic pad 308d serves as a contact for connecting with a driver chip. In addition, the conductive layer 308c, the scan line 302 underneath and the insulation layer 304 between the conductive layer 308c and the scan line 302 together form a pixel storage capacitor.

Figure 6D:
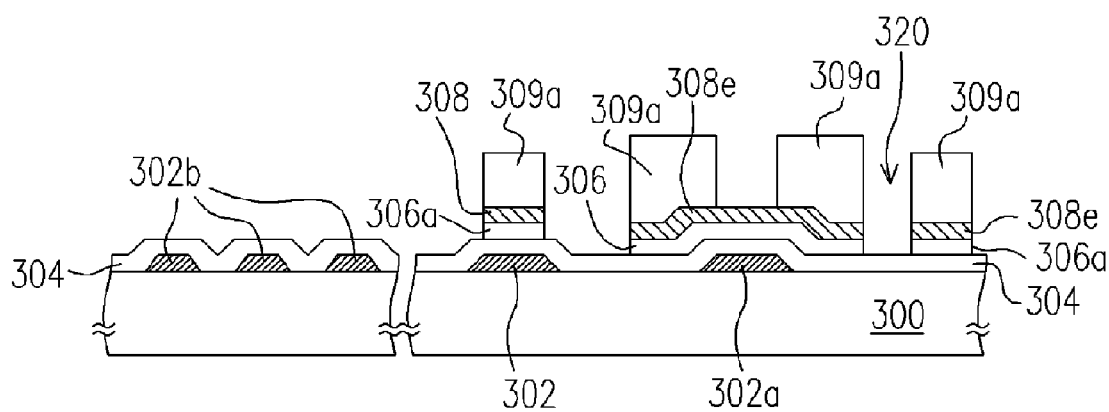

As shown in FIG. 6D, using the photoresist layer 309 again as an etching mask, the channel material layer 305 is etched to pattern out a channel layer 306. In here, although a portion of the channel material layer 306a still remains under the non-channel layer 308 such as the data line 308, its presence has little effect on the performance of the device. Furthermore, a definite thickness of the photoresist layer 309 is also removed during the etching step to form a photoresist layer 309a. The photoresist layer 309a exposes the source/drain metallic layer 308e above the gate 302a.

Figure 6E:
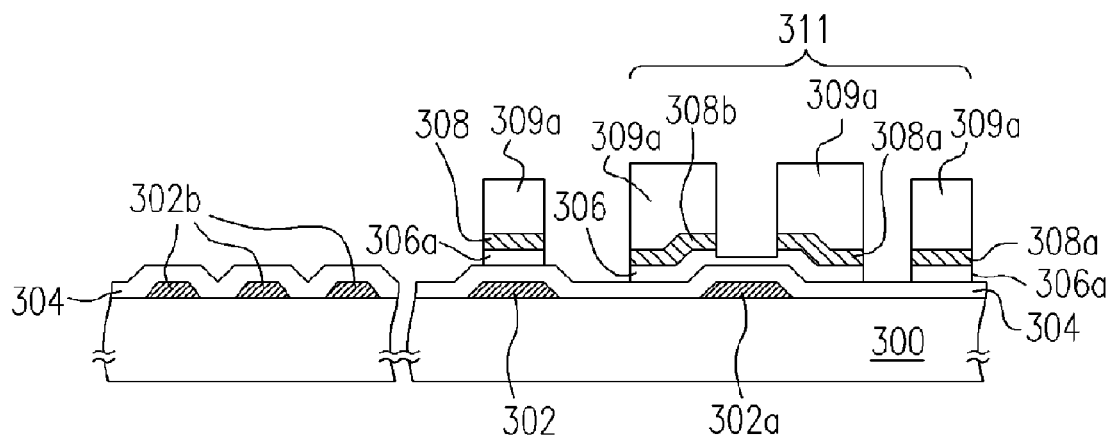

As shown in FIGS. 5 and 6E, using the photoresist layer 309a again as an etching mask, the source/drain metallic layer 308e is etched to pattern out source/drain terminals 308a/308b. This etching step also removes a definite thickness from the channel layer 306 above the gate 302a. The gate 302a, the channel layer 306 and the source/drain terminals 308a/308b together constitute a thin film transistor 311.

Figure 6F:
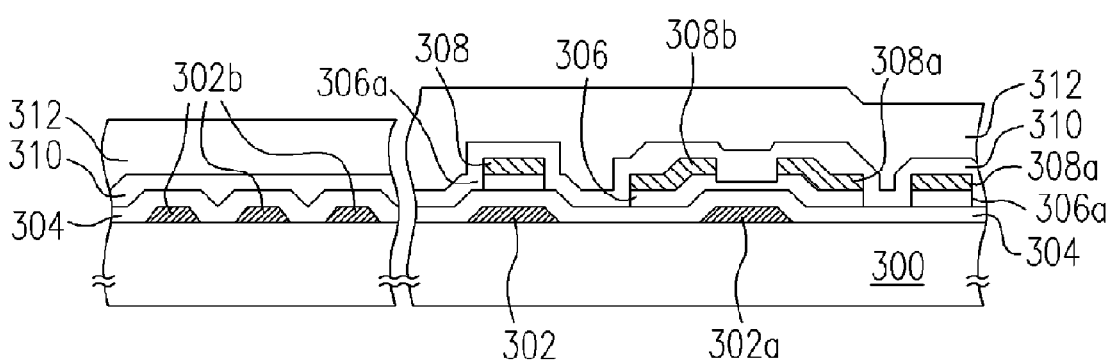

As shown in FIG. 6F, the photoresist layer 309a is removed and then a passivation layer 310 is formed over the substrate 300 globally covering the thin film transistor 311 in particular. In this embodiment, the passivation layer 310 is a silicon nitride layer formed, for example, by conducting a plasma-enhanced chemical vapor deposition. Thereafter, another photoresist layer 312 is formed over the passivation layer 310.

Figure 6G:
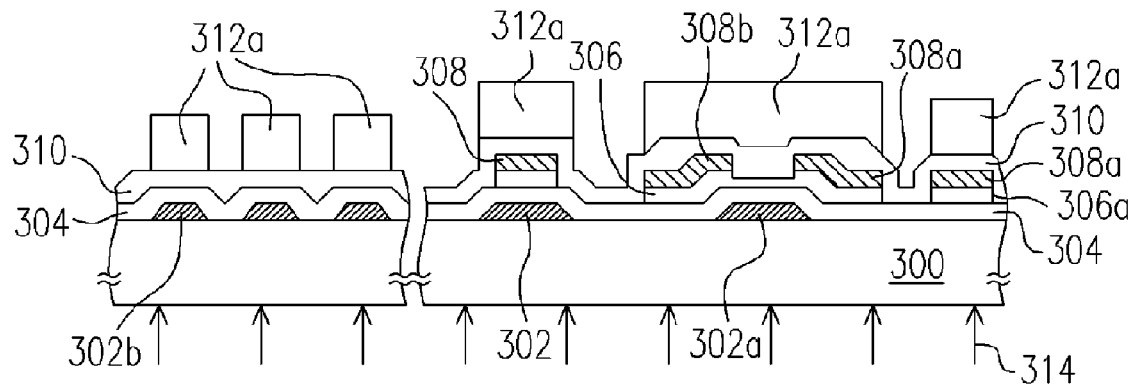

As shown in FIG. 6G, using the scan line 302, the gate 302a, the data line 308, the source/drain terminals 308a/308b, the conductive layer 308c and the metallic pads 302b, 308d as a photo-mask, a back exposure process 314 is conducted. The light source for conducting the back exposure process 314 beams in from the backside of the substrate 300. After the back exposure process 314, the photoresist layer 312 is chemically developed to form a patterned photoresist layer 312a.

Figure 6H:
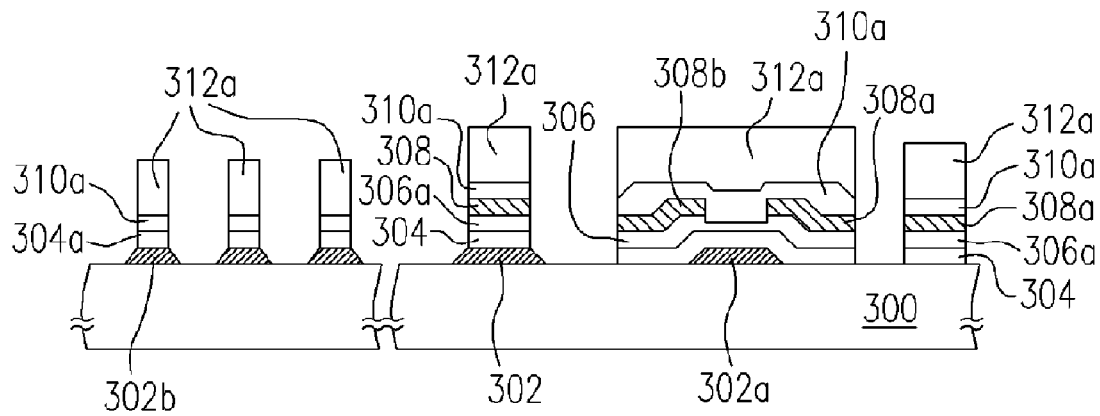

As shown in FIG. 6H, using the patterned photoresist layer 312a as an etching mask, the exposed the passivation layer 310 and the insulation layer 304 are removed to form a patterned passivation layer 310a and a patterned insulation layer 304a. Note that the sidewall of a portion of the metallic material layer (including the sidewall of the source/drain terminals 308a/308b) that also serves as a photo-mask is also exposed after the etching process. In other words, the outer sidewall of the drain terminal 308a is exposed. Furthermore, if the drain terminal 308a includes an opening 320, the inner sidewall surrounding the opening 320 is also exposed.

Note also that there is no need to fabricate a special photo-mask. This is because the scan line 302, the gate 302a, the data line 308, the source/drain terminals 308a/308b, the conductive layer 308c and the metallic pads 302b, 308c together can serve as a photo-mask. Therefore, this invention eliminates the need for producing a photo-mask to pattern the passivation layer.

Figure 6I:
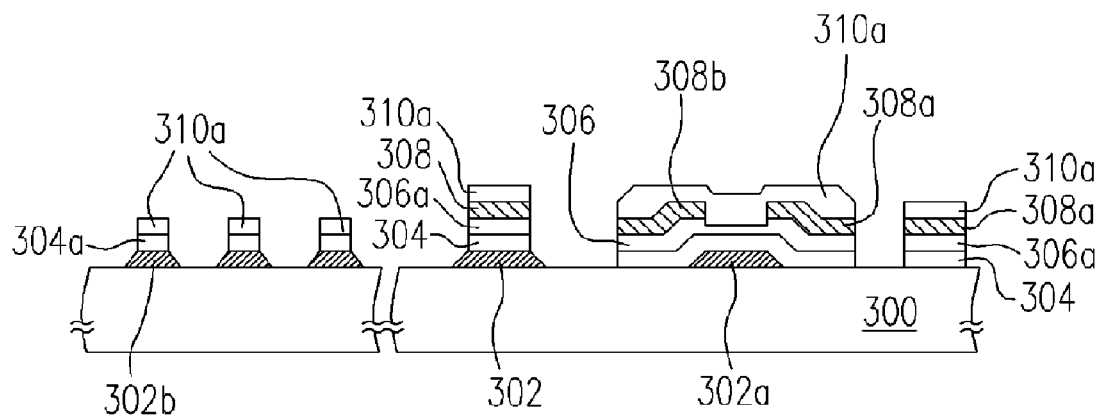
Figure 6J:
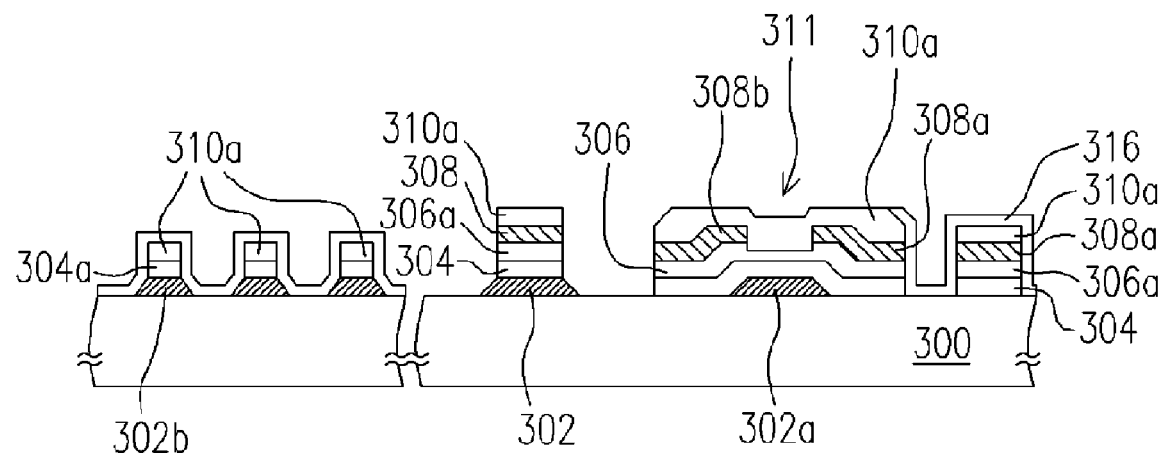

As shown in FIGS. 5, 6I and 6J, the photoresist layer 312a is removed and then a transparent electrode layer (not shown) is formed over the passivation layer 310a. The transparent electrode layer is an indium-tin oxide layer having a thickness of about 1000 Å formed by sputtering, for example. Thereafter, a third masking step is carried out to pattern the transparent electrode into a pixel electrode 316 that also covers over the drain terminal 308a.

Since the sidewall of the drain terminal 308a has already been exposed in a previous step, the pixel electrode 316 and the drain terminal 308a are electrically connected through the exposed sidewall of the drain terminal 308a. Similarly, the metallic pads 302b, 308d and the overlying transparent electrode layer are electrically connected through the exposed sidewalls.

Figure 7:
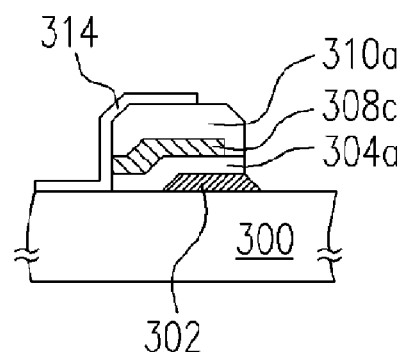
FIG. 7 is a cross-sectional view of the pixel storage capacitor structure along line II–II' of FIG. 5.

FIG. 7 is a cross-sectional view of the pixel storage capacitor structure along line II–II' of FIG. 5. As shown in FIG. 7, the scan line 302 is the lower electrode, the conductive layer 308c is the upper electrode and the insulation layer 304a between the scan line 302 and the conductive layer 208c is the dielectric layer of a pixel storage capacitor. Because the passivation layer 310a and the insulation layer 304a has already been patterned in previous steps and a sidewall of the conductive layer 308c and the scan line 302 are already exposed, the conductive layer 308c and the pixel electrode 316 are electrically connected through the sidewall of the conductive layer 308c. Consequently, the conductive layer 308c that also serves as the upper electrode of the pixel storage capacitor and the pixel electrode 316 are at an identical potential level.

The pixel structure according the second embodiment of this invention comprises a substrate 300, a thin film transistor 311, a pixel electrode 316, a conductive layer 308c, a patterned insulation layer 304a and a patterned passivation layer 310a. The pixel electrode is under the control of the data line 308 and the scan line 302.

The thin film transistor 311 is formed over the substrate 300. The thin film transistor 311 has a gate 302a, a channel layer 306 and source/drain terminals 308a/308b. The gate 302a and the scan line 302 are electrically connected. The gate 302a and the channel layer 306 are electrically insulated through the patterned insulation layer 304a. The source/drain terminals 308a/308b and the data line 308 above the channel layer 306 are electrically connected. The patterned passivation layer 310a is formed over the thin film transistor 311 for protecting the thin film transistor 311. The conductive layer 308c is formed over the insulation layer 304a either above the previous or the next scan line 302 in the pixel structure. The conductive layer 308c, the insulation layer 304a and scan line 302 under the conductive layer 308c together form the pixel storage capacitor of the pixel structure.

In the pixel structure of this invention, the passivation layer 310a and the insulation layer 304a is formed only in regions having a metallic material layer such as the gate 302a, the source/drain terminals 308a/308b, the conductive layer 308c, the data line 308, the scan line 302 and the metallic pads 302b, 308d. Furthermore, a portion of the sidewalls of the metallic material layer is also exposed.

In addition, a pixel electrode 316 is formed over the passivation layer 310a. The pixel electrode 316 is electrically connected to the drain terminal 308a through an exposed sidewall of the drain terminal 308a. The pixel electrode 316 is also similarly electrically connected to the underlying conductive layer 308c through an exposed sidewall of the conductive layer 308c. This invention may further include a conductive structure 320 formed within the passivation layer 310a such that the pixel electrode 316 and the source terminal 308a are electrically connected through the conductive structure 320 as well as the sidewall of the drain terminal 308a.

In fabricating the pixel structure of this invention, the passivation layer is patterned using metallic material layers (including the gate, the source/drain terminals) as photo-masks. Hence, one less masking step is required.

Moreover, the drain terminal of the thin film transistor and the pixel electrode in the pixel structure of this invention can be directly connected through the exposed sidewall of the drain terminal through a piece of conductive material embedded within an opening inside the passivation layer.

In the embodiment of this invention, the process of fabricating two types of thin film transistor is illustrated. However, the process can be applied to fabricate thin film transistors having some other structures. For example, the method of this invention can be applied to fabricate a thin film transistor having an etching stop layer on top of a channel layer.

It will be apparent to those skilled in the art that various modifications and variations can be made to the features of the present invention without departing from the scope or spirit of the invention. In view of the foregoing, it is intended that the present invention covers modifications and variations thereof, provided they fall within the scope of the following claims and their equivalents.

What is claimed is:

1. A pixel structure over a substrate, the pixel structure comprising:

a thin film transistor over the substrate, the thin film transistor having a gate, a channel layer and a pair of source/drain terminals;

a scan line over the substrate, the scan line and the gate being electrically connected;

a data line over the substrate, the data line and the source terminal being electrically connected;

a patterned insulation layer configured over the substrate exclusively in patterned areas vertically corresponding to the gate, the source/drain terminals, the data line and the scan line, the patterned insulation layer covering the gate and the scan line;

a passivation layer configured over the substrate exclusively in patterned areas vertically corresponding to the gate, the source/drain terminals, the data line and the scan line, the passivation layer covering the source/drain terminals and the data line, wherein a sidewall of the source/drain terminal is exposed; and a pixel electrode over the substrate, the pixel electrode being positioned close to the thin film transistor such that the pixel electrode and a sidewall of the drain terminal of the thin film transistor are electrically connected.

2. The pixel structure of claim 1, wherein the pixel structure further include a conductive structure within the passivation layer such that the pixel electrode and the drain terminal are electrically connected through the conductive structure as well as the sidewall of the drain terminal.

3. The pixel structure of claim 1, wherein the pixel structure further include a conductive layer over a scan line neighboring the original scan line such that the conductive layer, the neighboring scan line and the insulation layer between the conductive layer and the neighboring scan line together form a pixel storage capacitor.

4. The pixel structure of claim 3, wherein a sidewall of the conductive layer is electrically connected to the pixel electrode.

5. The pixel structure of claim 3, wherein the pixel structure further include a metallic pad near the edge of the substrate such that the metallic pad and the data line are electrically connected and that the pixel electrode and a sidewall of the metallic pad are electrically connected.

6. The pixel structure of claim 3, wherein the pixel structure further include a metallic pad near the edge of the substrate such that the metallic pad and the scan line are electrically connected and that the pixel electrode and a sidewall of the metallic pad are electrically connected.

7. The pixel structure of claim 3, wherein the pixel structure further include an ohmic contact layer over the channel layer.

8. The pixel structure of claim 3, wherein the pixel structure further include an etching stop layer over the channel layer.

* * * * *